US 6,643,604 B1

(12) United States Patent
Subramanian et al.

(10) Patent No.: US 6,643,604 B1
(45) Date of Patent: Nov. 4, 2003

(54) SYSTEM FOR UNIFORMLY HEATING PHOTORESIST

(75) Inventors: Ramkumar Subramanian, San Jose, CA (US); Michael K. Templeton, Atherton, CA (US); Bharath Rangarajan, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 343 days.

(21) Appl. No.: 09/608,091

(22) Filed: Jun. 30, 2000

(51) Int. Cl.[7] .................................................. G01K 1/00
(52) U.S. Cl. ....................... 702/130; 702/134; 702/135; 356/450
(58) Field of Search ................. 356/345, 346, 356/124, 124.5, 402, 432, 434; 392/418; 105/64, 80.4; 219/411, 390; 118/724, 732, 50.1; 62/3.3, 3.7, 179, 331; 702/130, 134, 135

(56) References Cited

U.S. PATENT DOCUMENTS

| | | | |
|---|---|---|---|
| 4,518,848 A | 5/1985 | Weber | |
| 4,863,547 A | 9/1989 | Shidahara et al. | |
| 5,635,409 A | 6/1997 | Moslehi | |
| 5,802,856 A | 9/1998 | Scaper | |
| 5,849,582 A | 12/1998 | Chen et al. | |
| 5,893,952 A | 4/1999 | Aronowitz et al. | |
| 6,002,108 A | 12/1999 | Yoshioka | |
| 6,018,616 A | * 1/2000 | Schaper | 392/418 |
| 6,033,474 A | 3/2000 | Mita et al. | |
| 6,034,771 A | * 3/2000 | Rangarajan et al. | 356/450 |
| 6,051,371 A | 4/2000 | Mita et al. | |
| 6,137,088 A | 10/2000 | Chen et al. | |
| 6,184,498 B1 | * 2/2001 | Kiyama | 219/390 |

FOREIGN PATENT DOCUMENTS

| | | |
|---|---|---|
| EP | 0762480 | 3/1997 |
| EP | 0831519 | 3/1998 |

OTHER PUBLICATIONS

"International Search Report", *International Searching Authority*, PCT/US01/13126, Mailed Dec. 21, 2001.

* cited by examiner

*Primary Examiner*—John Barlow
*Assistant Examiner*—Stephen J. Cherry
(74) *Attorney, Agent, or Firm*—Amin & Turocy, LLP

(57) ABSTRACT

A system for regulating heating temperature of a material is provided. The material may be a photoresist, a top or bottom anti-reflective coating, a low K dielectric material, SOG or other spin-on material, for example. The system includes a plurality of lamps and optical fibers, each optical fiber directing radiation to and heating a respective portions of a bakeplate on which the material is to be placed. In one embodiment, the temperature at various locations on the material placed on the bakeplate is determined and the heating rates are controlled in response to those measurements. In another aspect of the invention, the temperature at various portions of the bakeplate is determined and controlled. In this latter aspect, uniform heating of the material is a consequence of uniform bakeplate temperature.

25 Claims, 11 Drawing Sheets

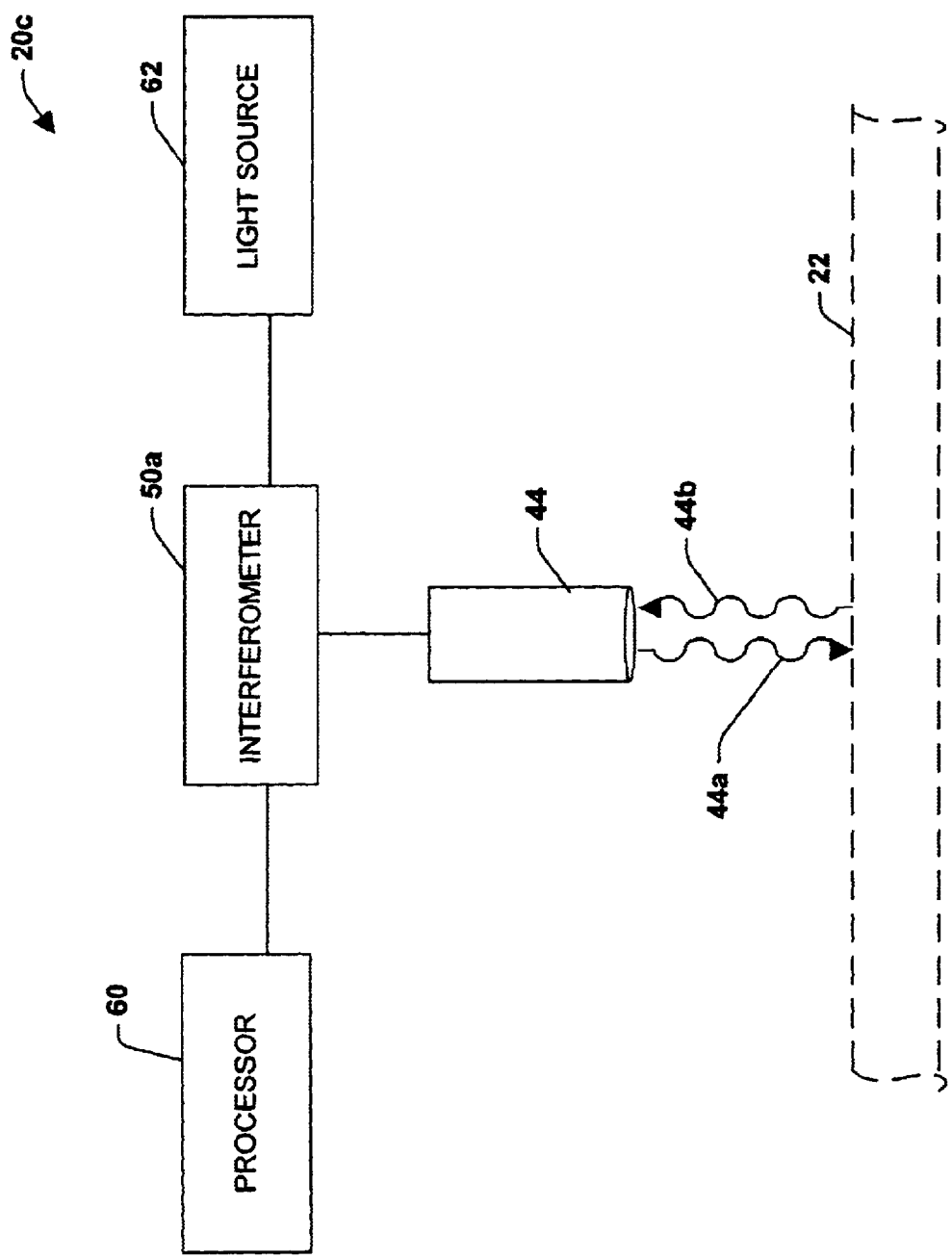

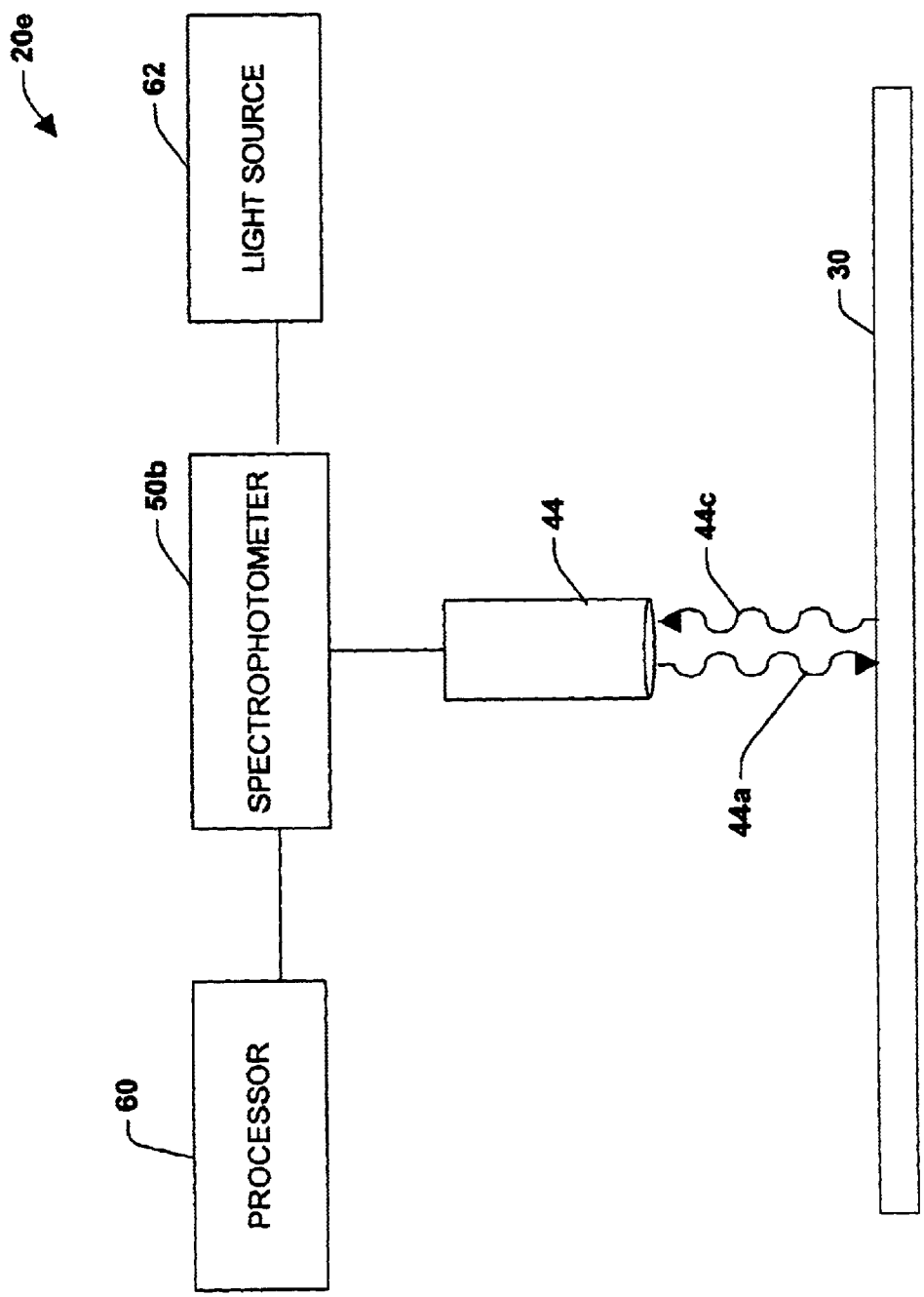

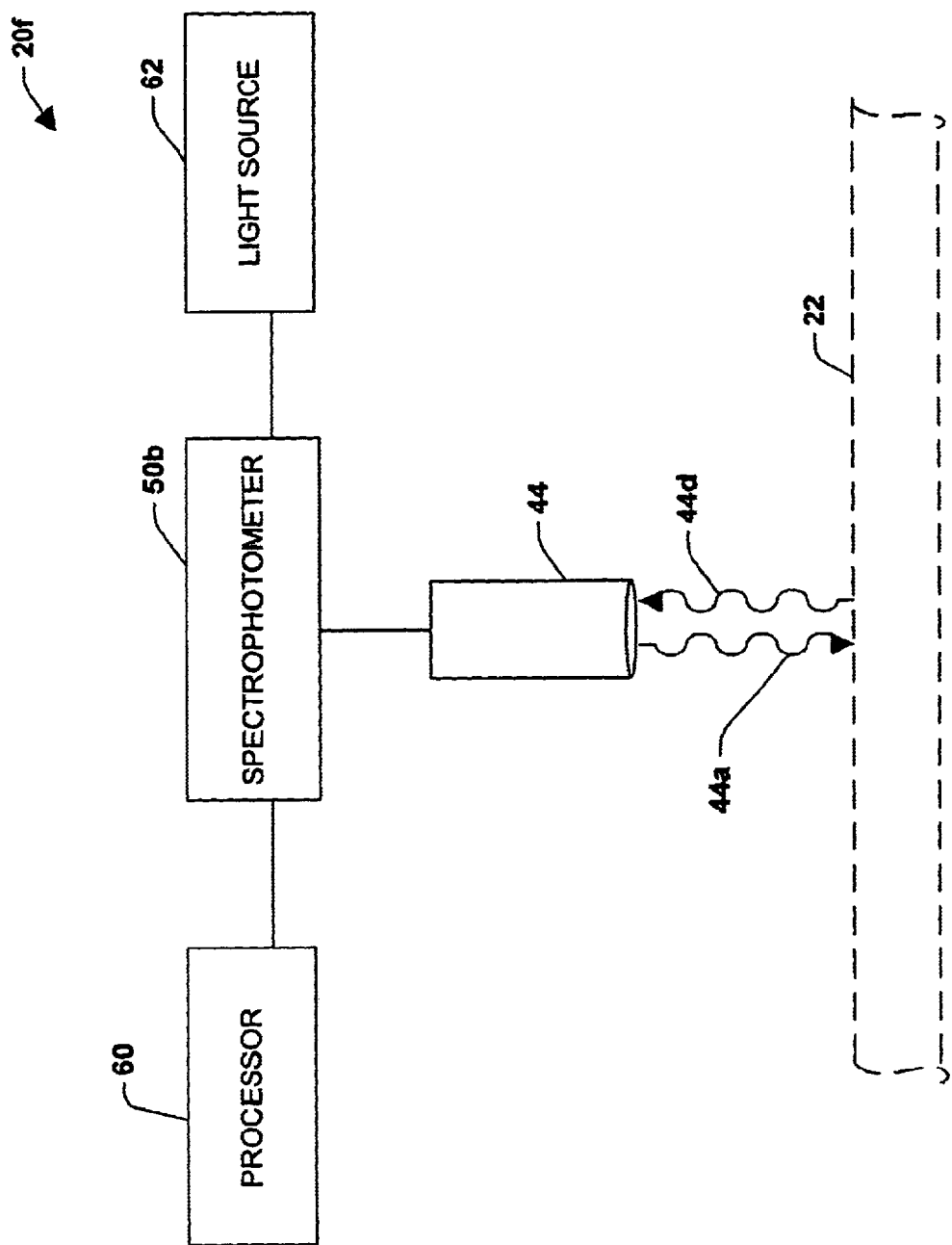

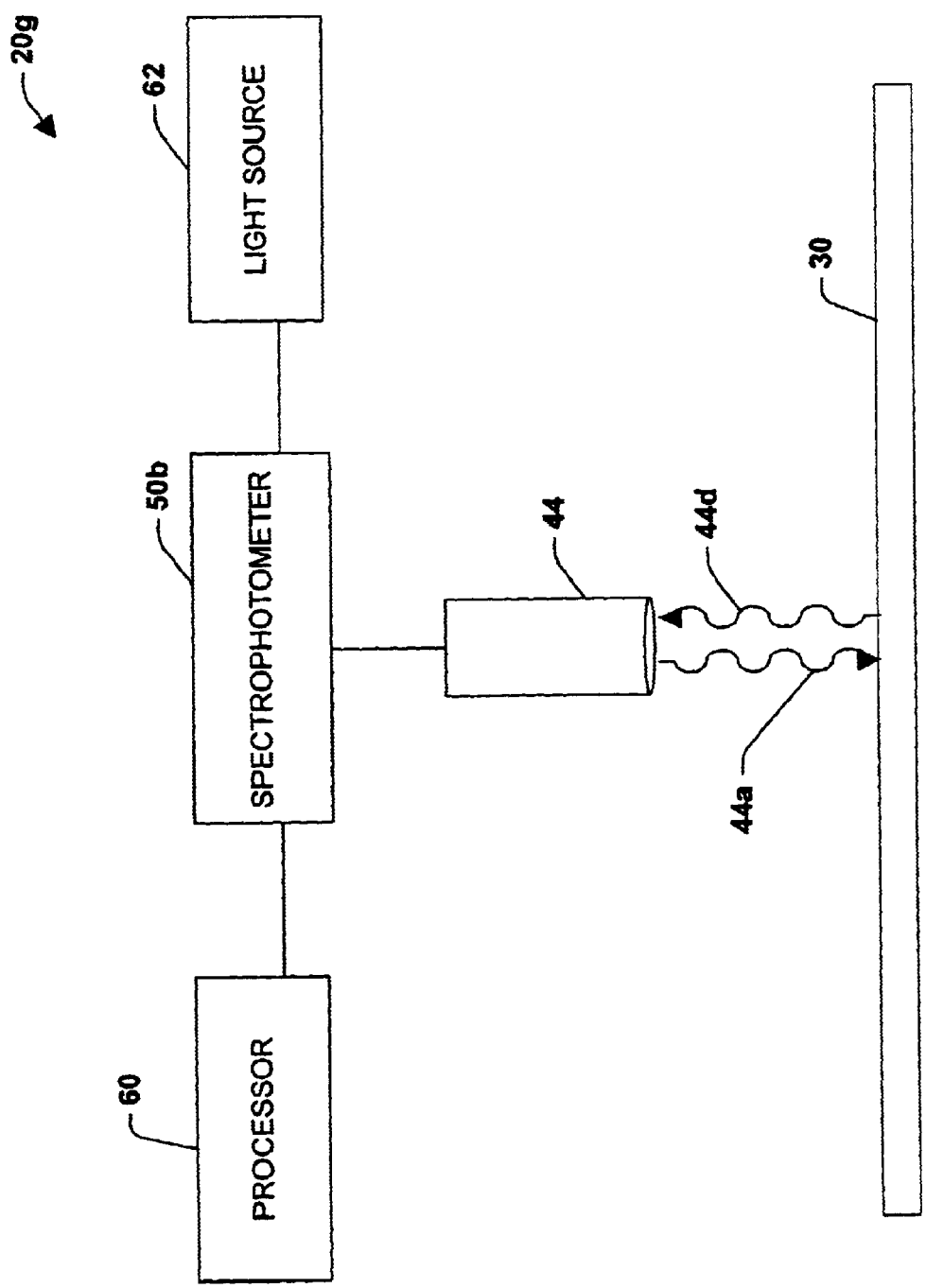

SYSTEM FOR UNIFORMLY HEATING PHOTORESIST

TECHNICAL FIELD

The present invention generally relates to semiconductor processing, and in particular to a system for uniformly heating a photoresist.

BACKGROUND OF THE INVENTION

In the semiconductor industry, there is a continuing trend toward higher device densities. To achieve these high densities there has been and continues to be efforts toward scaling down device dimensions (e.g., at submicron levels) on semiconductor wafers. In order to accomplish such high device packing density, smaller and smaller features sizes are required. This may include width and spacing of interconnecting lines, spacing and diameter of contact holes, and surface geometry such as corners and edges of various features.

The requirement of small features with close spacing between adjacent features requires high resolution photolithographic processes. In general, lithography refers to processes for pattern transfer between various media. It is a technique used for integrated circuit fabrication in which a silicon slice, the wafer, is coated uniformly with a radiation-sensitive film, the resist, and the film exposed with a radiation source (such as optical light, x-rays, or an electron beam) that illuminates selected areas of the surface through an intervening master template, the mask, forming a particular pattern. The lithographic coating is generally a radiation-sensitive coating suitable for receiving a projected image of the subject pattern. Once the image is projected, it is indelibly formed in the coating. The projected image may be either a negative or a positive image of the subject pattern. Exposure of the coating through a photomask causes the image area to become either more or less soluble (depending on the coating) in a particular solvent developer. The more soluble areas are removed in the developing process to leave the pattern image in the coating as less soluble polymer.

Proper preparation of the photoresist is critical to obtaining extremely fine patterns after exposure of the photoresist. In a typical process, a few droplets of photoresist are applied to a spinning wafer. The photoresist is then "softbaked" to remove solvent and anneal. The properties of the photoresist, and the quality of pattern transfer, are affected by the heating temperature and time. To achieve uniformity and quality of the photoresist layer, heating must be uniform and temperature must be accurately controlled.

Both the overall temperature history, and variations in the temperature history across the photoresist must be controlled. For example, baking time and temperature affect the photoresist layer thickness. While the layer thickness is typically in the range of 0.1 to 3.0 microns, variances in thickness should be kept less than +10–20 Å across the wafer. Small variations in the time/temperature history across the photoresist can substantially alter image sizes, resulting in lack of image line control. A uniform time/temperature history of the photoresist is especially important with chemically amplified photoresists because image size control may be drastically affected by only a few degrees difference in temperature. Often substantial line size deviations occur when the temperature is not maintained within 0.5 degree tolerance across a silicon wafer. For example, when a photoresist is baked onto a substrate (e.g., wafer), temperature tolerances of ±0.2° C. are required.

Efficient systems and methods for uniformly and rapidly heating layers of temperature-sensitive film formed on semiconductor substrates are therefore desired to increase fidelity in image transfer.

SUMMARY OF THE INVENTION

The present invention provides a system that can be used to control photoresist baking temperature so as to facilitate uniform heating of a photoresist formed on a semiconductor substrate (e.g., wafer). The system includes a bakeplate on which a coated wafer can be placed; a plurality of lamps, and a plurality of optical fibers configured to direct radiation to various portions of the bakeplate. At least one lamp driving device is used to drive the lamps and at least one measuring device is used to measure a parameter indicative of temperature. In one aspect of the invention, the temperature is measured at a plurality of location on the bakeplate. In accordance with another aspect, the temperature is measured at a plurality of locations on a coated wafer, when such a wafer is placed on the bakeplate. A processor operatively coupled to the at least one measuring device and the at least one lamp driving system, is capable of receiving data from the at least one measuring device and is configured to control, at least partially based on such data, the at least one lamp driving device so as to regulate temperature at the plurality of locations where temperature is measured. Temperature may be measured based on reflected radiation; the temperature measuring device may be a spectrophotometer or an interferometer. The spectrophotometer may measure either absorptivity or color. It is preferred to use a spectrophotometer measuring absorptivity. When bakeplate temperature is measured, the bakeplate may include europium chelate.

In one aspect of the invention, the system is configured to monitor temperature of a coating on a wafer, when such a wafer is placed on a bakeplate, and to selectively drive a plurality of heaters so as to maintain the coating temperature at a desired level. Substantial uniformity in heating may thereby be achieved, increasing fidelity of image transfer. In another aspect, the system is configured to monitor and keep uniform the bakeplate temperature, which has the effect of maintaining a substantially uniform temperature of a coated wafer when placed on the bakeplate.

Another aspect of the present invention is a method, comprising the steps of placing a coated wafer on top of a bakeplate, heating a plurality of portions of the bakeplate; measuring a parameter indicative of the coating temperature at a plurality of locations on the coating, and independently controlling the heating of each of the bakeplate portions to regulate the coating temperature at each of the locations where temperature is measured.

A further aspect of the present invention is a method comprising the steps of placing a coated wafer on top of a bakeplate, heating a plurality of portions of the bakeplate; measuring a parameter indicative of temperature at a corresponding plurality of locations on the bakeplate, and independently controlling heating of each of the bakeplate portions to regulate bakeplate temperature at each of the corresponding locations where temperature is measured.

The following description and the annexed drawings set forth in detail the invention and certain illustrative aspects of the invention. The illustrative aspects are indicative of but a few of the various ways in which the principles of the invention may be employed. Other objects, advantages and novel features of the invention will become apparent to one of ordinary skill in the art from the following detailed

BRIEF DESCRIPTION OF THE DRAWINGS

FIG. 1c is a partial schematic block diagram of the system of FIG. 1a being employed in connection with determining photoresist temperature by measuring photoresist thickness in accordance with the present invention;

FIG. 1e is a partial schematic block diagram of the system of FIG. 1b being employed in connection with determining photoresist temperature by measuring bakeplate color in accordance with the present invention;

FIG. 1f is a partial schematic block diagram of the system of FIG. 1a being employed in connection with determining photoresist temperature by measuring photoresist absorptivity in accordance with the present invention;

FIG. 1g is a partial schematic block diagram of the system of FIG. 1b being employed in connection with determining photoresist temperature by measuring bakeplate absorptivity in accordance with the present invention;

DETAILED DESCRIPTION OF THE INVENTION

Figure 1A:
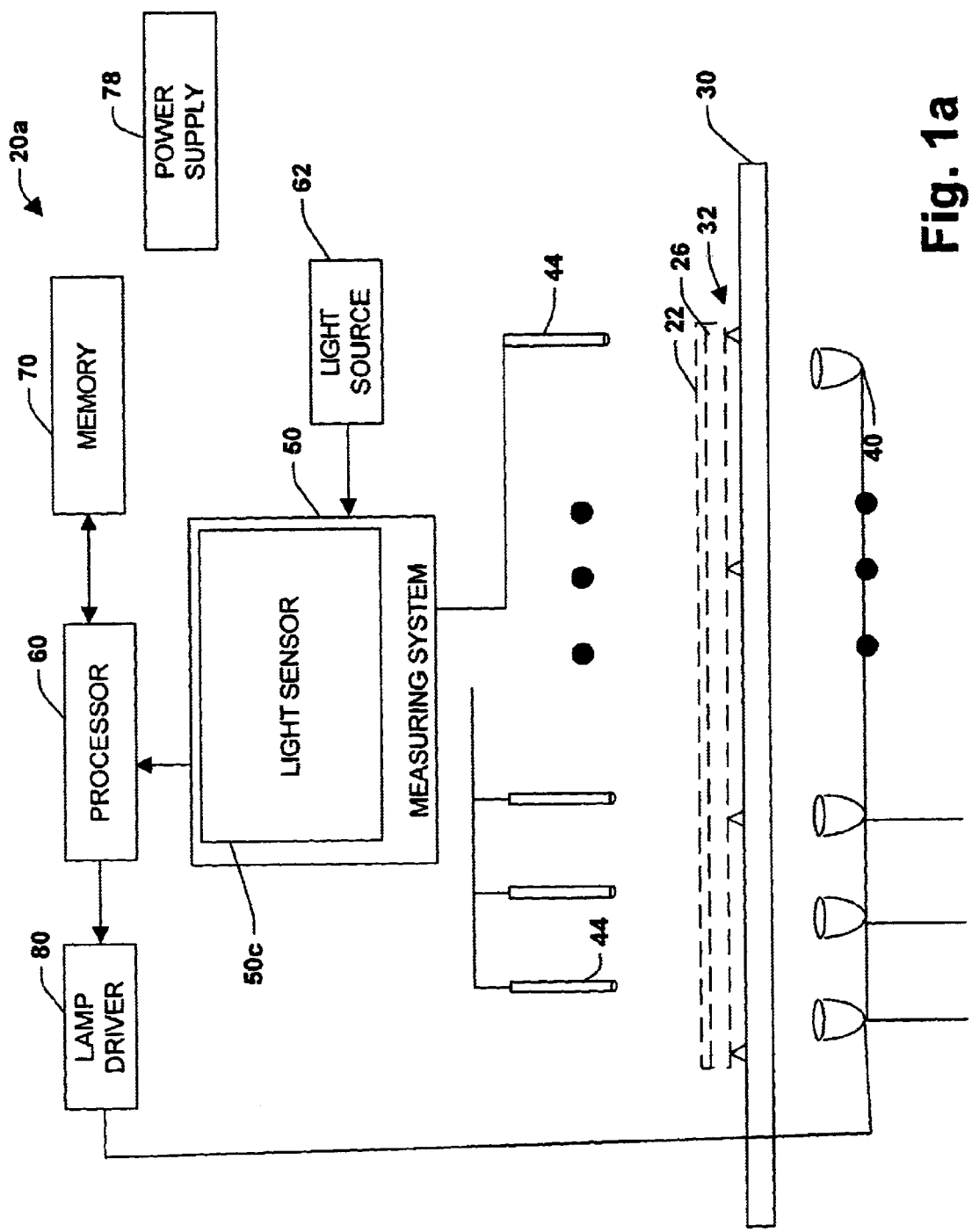
FIG. 1a is schematic block diagram of a photoresist heating system in accordance with the present invention.

The present invention will now be described with reference to the drawings, wherein like reference numerals are used to refer to like elements throughout. The present invention is a system and method that can be used to uniformly heat a photoresist using a plurality of heaters. It is to be appreciated that the present invention may be applied to pre-baking as well as post exposure baking of the photoresist. Furthermore, although the present invention is primarily described within the context of heating photoresist, it is to be understood that the present invention may be applied to heating of top and bottom anti-reflective coatings, low K dielectric materials, spin-on-glass (SOG) and other spin-on materials.

Referring initially to FIG. 1a, a system 20a for heating a photoresist 22 is shown. The photoresist 22 and substrate 26 are not part of the system. A plurality of proximity pins 32 prevent contact between the substrate 26 and a bakeplate 30 when the substrate 26 is placed on a bakeplate 30. The proximity pins 32 elevate the substrate 26 about 1 mm above the surface of the bakeplate 30. Preventing contact of the substrate 26 with the plate 30 mitigates contamination of the substrate 26 by particles from the bakeplate 30. However, it is to be appreciated that the scope of the present invention is intended to cover systems where the substrate will be in contact with the bakeplate. In fact, it is recognized that removing the pins 32 would improve heat transfer between the bakeplate 30 and the substrate 26 thereby facilitating temperature control across the photoresist.

The system 20a uses a plurality of heat lamps 40 as heating devices. These lamps can be selectively controlled to facilitate uniform heating of the photoresist 22 when coated on the substrate 26 and placed on the bakeplate 30. Preferably, the bakeplate 30 has a high thermal conductivity to facilitate uniformity in temperature. A fan (not shown) to increase convection within the system may also promote uniformity in temperature. A plurality of optical fibers 44 are configured to project radiation onto respective portions of the bakeplate 30. A measuring device is configured to collect and process radiation reflected from the photoresist 22 and determine at least one parameter relating to the temperature of the photoresist 22.

FIG. 1a illustrates a measuring system 50, which includes a light sensor 50c such as for example an interferometer or/and a spectrometer. It is to be appreciated that any stable measuring system may be employed to carry out the present invention and such systems are intended to fall within the scope of the hereto appended claims. Interferometers, spectrometers, and other measuring devices are well known in the art, and further discussion related thereto is omitted for sake of brevity.

A source 62 of monochromatic radiation, such as a laser, provides radiation to the surface of the bakeplate 30, which is reflected into the plurality of optical fibers 44, which guide the radiation to the measuring device 50. Preferably, the radiation source 62 is a frequency stabilized laser, however, it will be appreciated that any laser or other radiation source (e.g., laser diode or helium neon (HeNe) gas laser) suitable for carrying out the present invention may be employed.

A processor 60 receives the measured data from the measuring system 50 and determines temperature of respective portions of the photoresist 22. The processor 60 is operatively coupled to the measuring system 50 and is programmed to control and operate the various components within the heating system 20a in order to carry out the various functions described herein. The manner in which the processor 60 can be programmed to carry out the functions relating to the present invention will be readily apparent to those having ordinary skill in the art based on the description provided herein.

A memory 70 which is operatively coupled to the processor 60 is also included in the system 20a and serves to store program code executed by the processor 60 for carrying out operating functions of the system 20a as described herein. The memory 70 also serves as a storage medium for temporarily storing information such as photoresist temperature, temperature tables, photoresist coordinate tables, interferometry information, spectrometry information and other data which may be employed in carrying out the present invention.

Power supply 78 provides operating power to the system 20. Any suitable power supply (e.g., battery, line power) may be employed to carry out the present invention.

The processor 60 is also coupled to a lamp driving device 80 that drives the heat lamps 40. The lamp driving device may be, for example, a set of rheostats. The lamp driving device 80 is controlled by the processor 60 so as to selectively vary heat output of the respective heat lamps 40. That lamps are preferably configured such that each respective portion of the photoresist 22 will have a corresponding portion of the bakeplate 30 and a corresponding lamp 40 and optical fiber 44 associated therewith. The processor 60 is able to monitor the temperature of the various photoresist portions and selectively regulate the temperatures of each portion by applying heat to various portions of bakeplate 30 through heat lamps 40. As a result, the system 20a provides for regulating temperature of a photoresist 22 with substantial uniformity, which in turn improves fidelity of image transfer in a lithographic process employing such a photoresist 22.

Figure 1B:
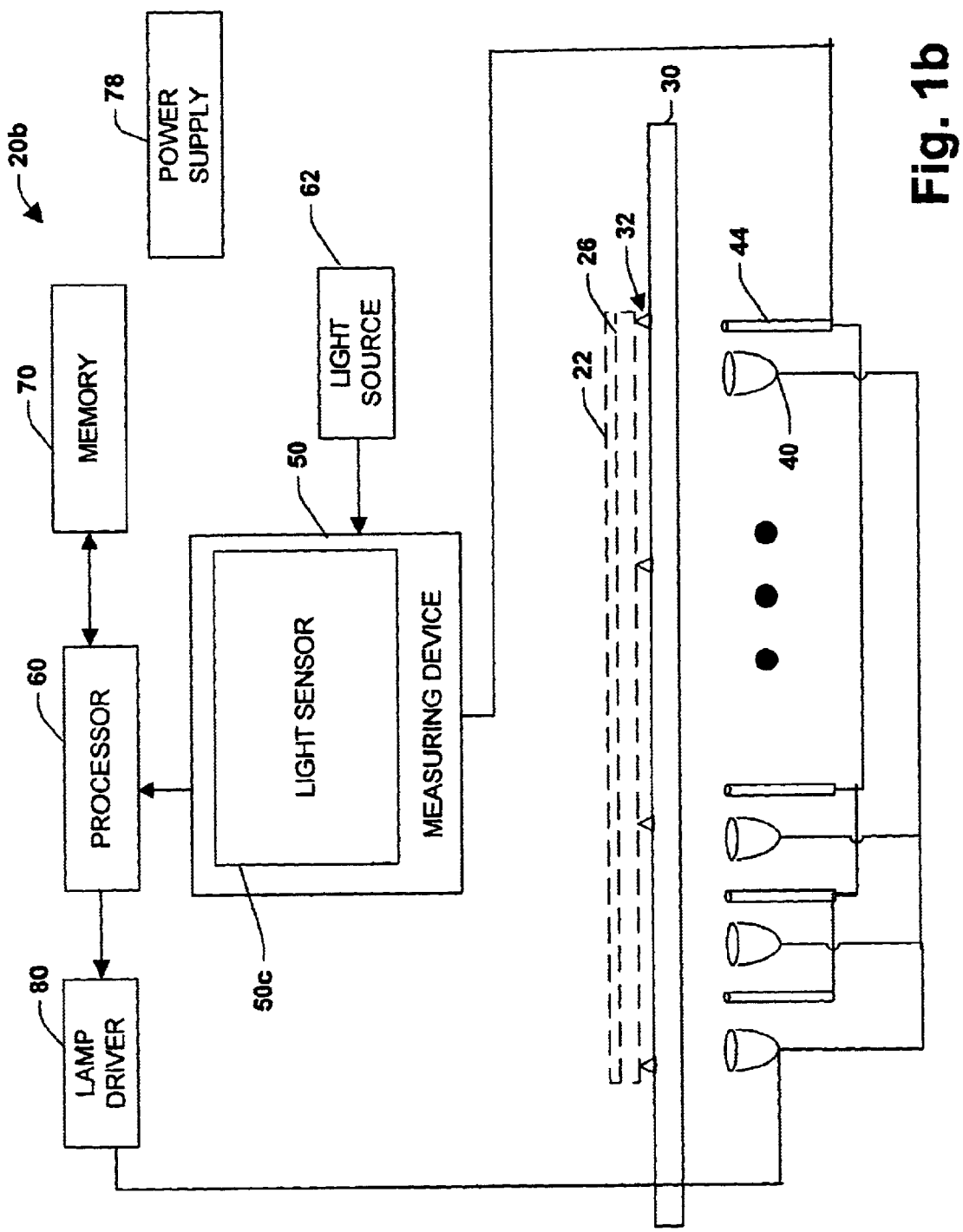
FIG. 1b is schematic block diagram of another photoresist heating system in accordance with the present invention.

FIG. 1b illustrates a system 20b where the measuring system 50 and optical fibers 44 are configured to measure parameters indicative of temperature at a plurality of locations on bakeplate 30. The processor 60 of the system 20b is configured to operate the lamp driving system 80 to control the temperature of the various portions of the bakeplate 30 where temperature is detected. Maintaining uniform bakeplate temperature is intended to maintain uniform temperature in a photoresist 22 when such a photoresist coated on a wafer 26 is placed on bakeplate 30. An alternate aspect of system 20b omits the light source 62 and optical fibers 44 and employs a measuring system which includes thermocouples.

FIG. 1c illustrates a system 20c that has an interferometer 50a configured to measure thickness of a photoresist 22 at a particular position. The temperature of the photoresist 22 will have an impact on its thickness. The optical fiber 44 directs radiation 44a to the surface of the photoresist 22, and the phase and/or intensity of reflected radiation 44b from the surface of photoresist will vary in accordance with the thickness of the photoresist 22. The measuring system 50 collects the reflected radiation 44b and processes the reflected radiation 44b in accordance with interferometry techniques to provide the processor 60 with data corresponding to the thickness of the photoresist 22. The processor 60 analyzes the data and determines the temperature of the photoresist 22.

Figure 1D:
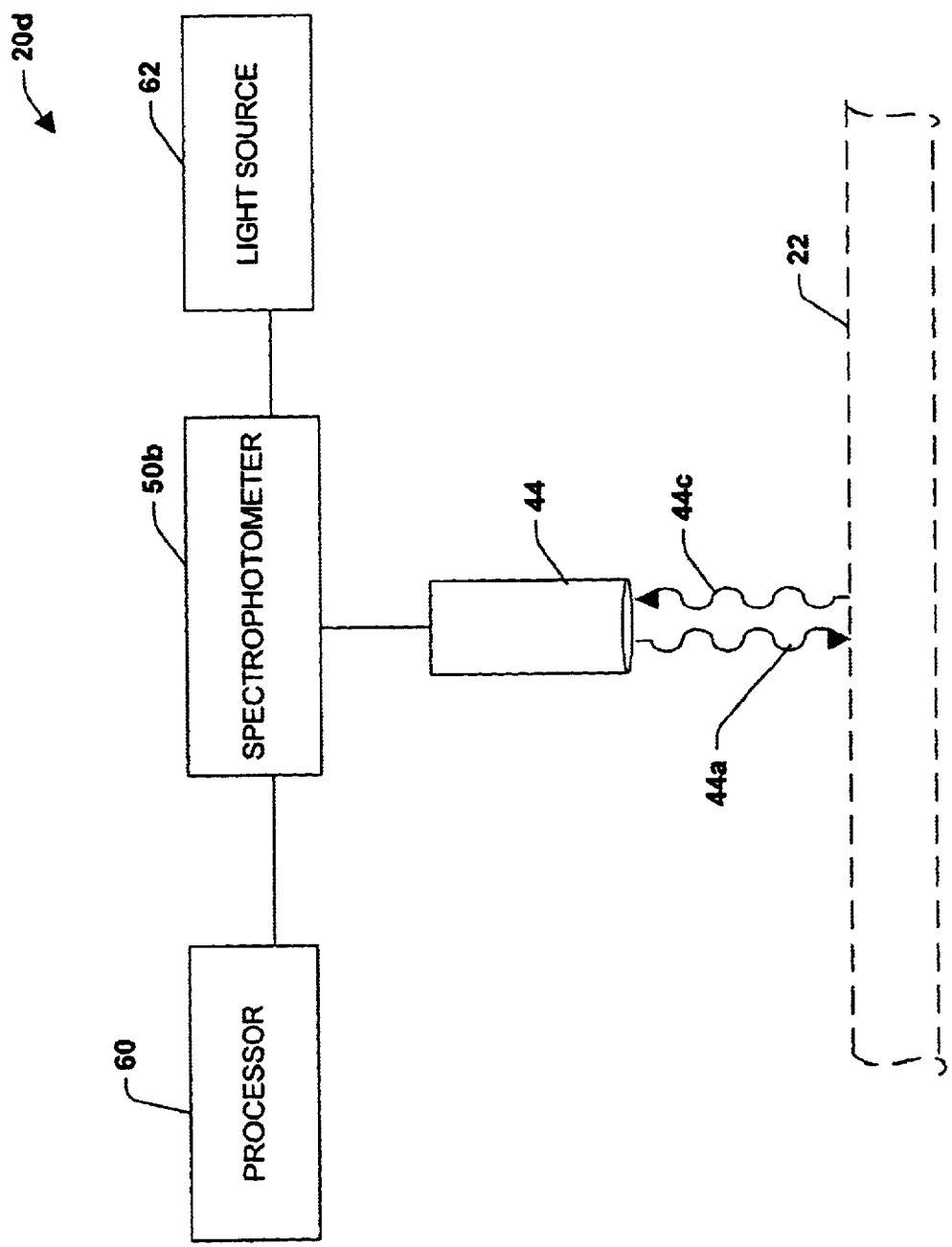
FIG. 1d is a partial schematic block diagram of the system of FIG. 1a being employed in connection with determining photoresist temperature by measuring photoresist color in accordance with the present invention.

FIG. 1d illustrates a system 20d that is configured to measure fluorescence of a photoresist or similar material 22, when placed in the system. It is contemplated that the fluorescent material will be substantially inert and not impede the performance of the photoresist 22 or other material to be heated is used. Europium chelate is an example of a suitable material for use with a photoresist. The fluorescent material 22 to vary in accordance with the temperature thereof. The optical fiber 44 directs the radiation 44a incident to the surface of the photoresist and the color of the reflected radiation 44c will vary in accordance with the temperature of the photoresist 22. The measuring system 50 collects the reflected radiation 44c and processes the reflected radiation in accordance with spectrometry techniques to provide the processor 60 with data corresponding to the color of the photoresist 22. The processor 60 analyzes the data and determines the temperature of the photoresist 22.

FIG. 1e illustrates a system 20e that measures fluorescence of the bakeplate 30. A fluorescent material is coated on the bakeplate 30 such that the color of the bakeplate 30 will vary in accordance with the temperature thereof. The fluorescent material may be an inert material, such as europium chelate, however the choice of fluorescent materials will be much wider when the material is placed on the bakeplate rather than the photoresist or similar material to be heated. The optical fiber 44 directs the radiation 44a incident to the surface of the bakeplate 30 and the color of the reflected radiation 44c will vary in accordance with the temperature of the bakeplate 30. The measuring system 50 collects the reflected radiation 44c and processes the reflected radiation 44c in accordance with spectrometry techniques to provide the processor 60 with data corresponding to the color of the photoresist 22. The processor 60 analyzes the data and determines the temperature of the bakeplate 22.

FIG. 1f illustrates a system 20f that measures absorptivity of the photoresist 22. The absorption of the incident radiation 44a by a photoresist 22 corresponds to the temperature of the photoresist 22. Accordingly, the intensity of reflected radiation 44d will be indicative of the absorptivity of the photoresist 22 which in turn is indicative of photoresist temperature. The measuring system 50 collects the reflected radiation 44d and processes the reflected radiation 44d in accordance with spectrometry techniques to provide the processor 60 with data corresponding to the absorptivity of the photoresist 22. The processor 60 analyzes the data and determines the temperature of the photoresist 22.

FIG. 1g illustrates a system 20g that measures absorptivity of the bakeplate 30. The absorption of the incident radiation 44a by a bakeplate 30 corresponds to the temperature of the bakeplate 30. Accordingly, the intensity of reflected radiation 44d will be indicative of the absorptivity of the bakeplate 30, which in turn is indicative of bakeplate temperature. The measuring system 50 collects the reflected radiation 44d and processes the reflected radiation 44d in accordance with spectrometry techniques to provide the processor 60 with data corresponding to the absorptivity of the bakeplate 30. The processor 60 analyzes the data and determines the temperature of the bakeplate 30.

It is to be appreciated that although FIGS. 1a–g are described herein with respect to heating a photoresist 22, these systems may be used to heat any other suitable material (e.g., top and bottom anti-reflective coatings, low K dielectric materials, spin-on-glass (SOG) and other spin-on materials).

Figure 2:
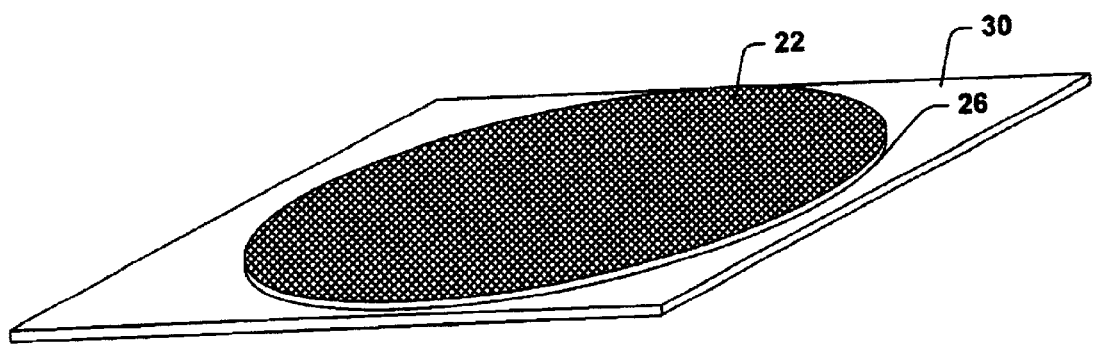
FIG. 2 is a perspective illustration of a top side of a bakeplate, and a substrate having a photoresist formed thereon.
Figures 3, 4:
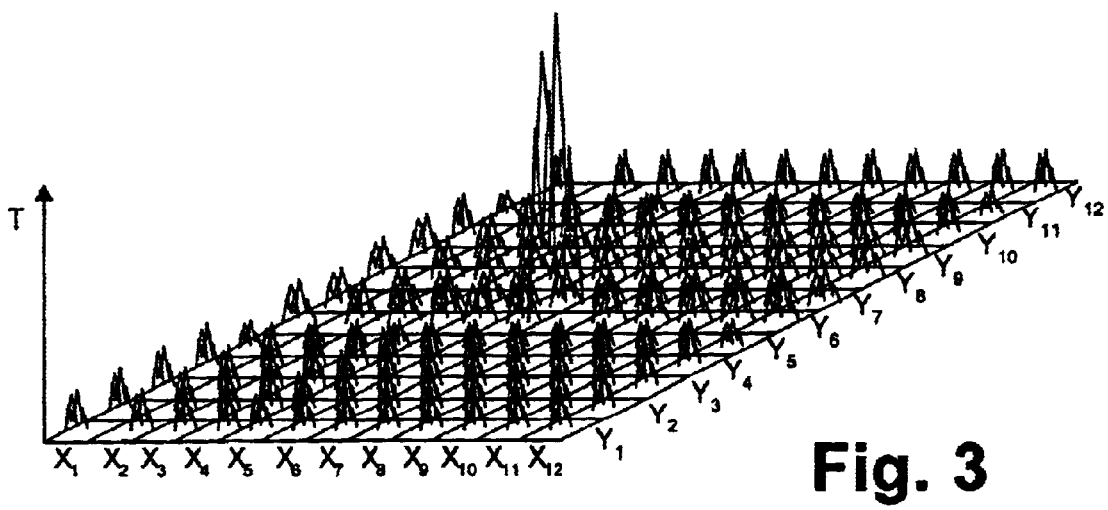
FIG. 3 is a representative three-dimensional grid map of a photoresist illustrating temperature amplitudes taken at grid blocks of the grid map in accordance with the present invention.
FIG. 4 is a temperature amplitude table correlating the temperature amplitudes of FIG. 3 with desired values for the temperature amplitudes in accordance with the present invention.

Turning now to FIGS. 2–4 the bakeplate 30 is shown in perspective supporting a substrate 26 having a photoresist 22 thereon. The photoresist heating system 20 provides for regulating temperature of the photoresist 22 during the above described heating process in order to maintain uniform temperature. The photoresist 22 may be divided into a grid pattern as that shown in FIG. 3. Each grid block (XY) of the grid pattern corresponds to a particular portion of a photoresist 22, and each portion is individually monitored and controlled for temperature. Preferably, there is one heat source for each temperature measured and the temperatures of the various regions are controlled individually. However, it is to be understood that while it is preferred that the temperatures and lamps be controlled individually and that one optical fiber 44 and one lamp 40 corresponds to each grid block XY, the numbers and positions of the optical fibers 44 and the lamps 40 need not correspond.

In FIG. 3, each respective portion of the photoresist $(X_1Y_1 \ldots X_{12}, Y_{12})$ is being monitored for temperature using a respective optical fiber 44, the measuring system 50 and the processor 60. The temperature amplitudes of each photoresist portion is shown. As can be seen, the temperature of the photoresist at coordinate $X_7Y_6$ is substantially higher than the temperature of the other photoresist portions XY. It is to be appreciated that although FIG. 3 illustrates the photoresist 22 being mapped (partitioned) into 144 grid block portions, the photoresist 22 may be mapped with any suitable number of portions.

FIG. 4 is a representative table of temperature amplitudes (taken at the various grid blocks which have been correlated with acceptable temperature amplitude values for the portions of the photoresist 22 mapped by the respective grid blocks. As can be seen, all of the grid blocks except grid block $X_7Y_6$ have temperature amplitudes corresponding to an acceptable temperature value ($T_A$) (e.g., are within an expected range of temperature amplitudes), while grid block $X_7Y_6$ has an undesired temperature value ($T_U$). Thus, the processor 60 has determined that an undesirable temperature condition exists at the portion of the photoresist 22 mapped by grid block $X_7Y_6$. Accordingly, the processor 60 can drive the lamp $40_{7,6}$ which corresponds to the portion of the photoresist 22 mapped at grid block $X_7Y_6$ so as to bring the temperature of this portion of the photoresist 22 down to an acceptable level. It is to be appreciated that the lamps 40 may be driven so as to increase and/or decrease the temperature of the respective photoresist portions as desired.

Figure 5:
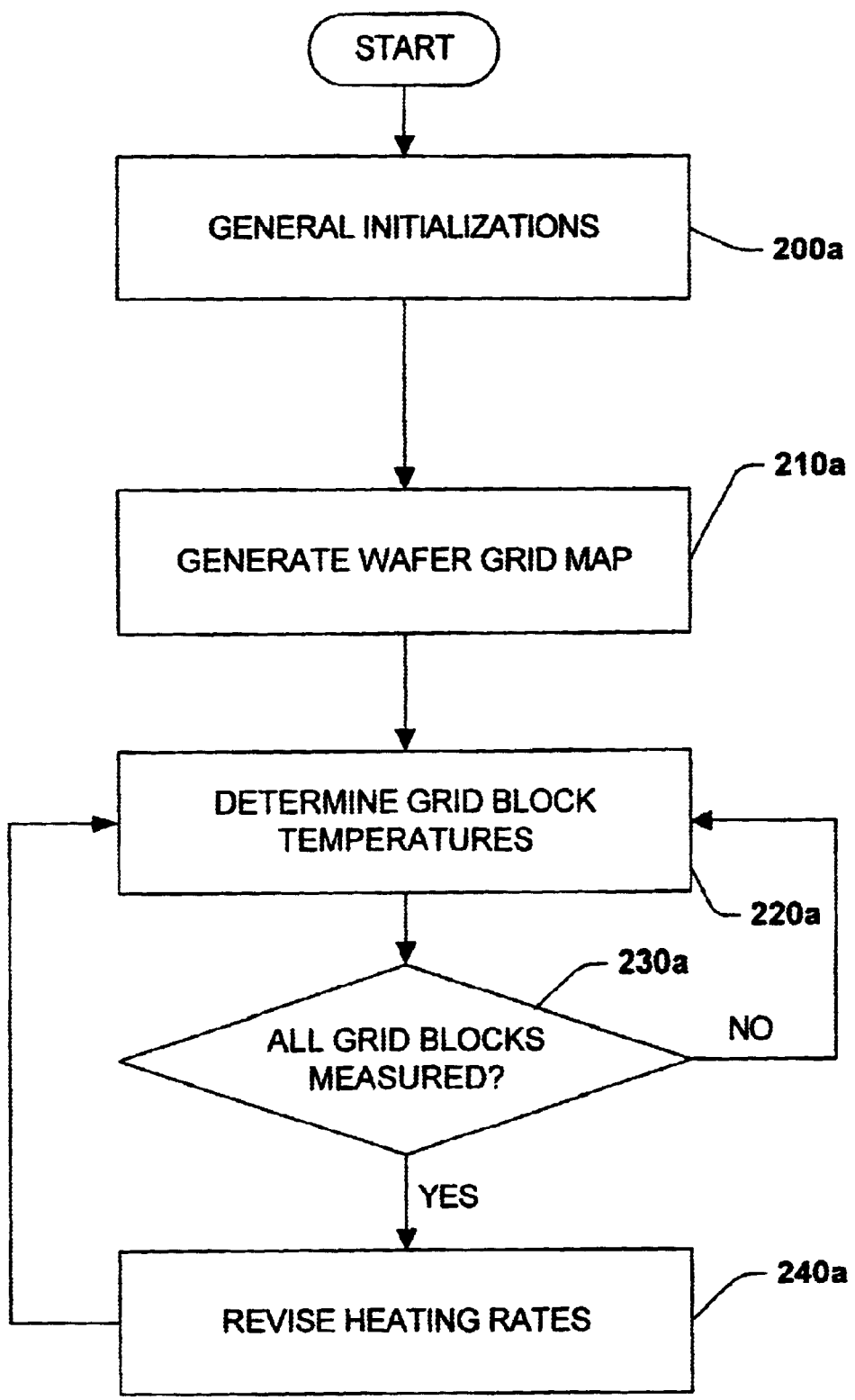
FIG. 5 is a flow diagram illustrating one specific methodology for carrying out the present invention.

FIG. 5 is a flow diagram illustrating one particular methodology for carrying out the present invention. In step 200a, the processor 60 performs general initializations to the photoresist heating system 20a. In step 210a, the processor 60 maps at least a portion of the photoresist 22 into a plurality of grid blocks "XY". During step 210a, a determination can be made as to which optical fibers 44 are detecting light reflected from a photoresist. Alternatively, the system 20a may be configured so that the fibers 44 always detect light reflected from a photoresist when a photoresist coated wafer of standard dimensions is placed in the system 20a. In step 220a, temperature determinations are made with respect to the various photoresist portions mapped by the respective grid blocks XY. In step 230a, the processor 60 determines if all grid block measurements have been taken. If no, the processor 60 returns to step 220a. In step 240a, the processor 60 adjusts the heating rate for each lamp in accordance with the most recently measured temperatures, any temperatures determined during preceding iterations, and target temperature levels for the current time all in accordance with the control strategy. The present iteration is then ended and the process returns to step 220a to perform another iteration.

Each lamp 40 may be controlled based on the temperature measured from one optical fiber 44. The control strategy is preferably a standard PID (Proportional, Integral, Derivative) control strategy, which sets the heating rate for the lamp based on a combination of the current difference between the target (set-point) temperature and the measured temperature, the rate at which the temperature is changing, and the integral of the difference between the target temperature and the measured temperature over a preceding interval of time.

Figure 6:
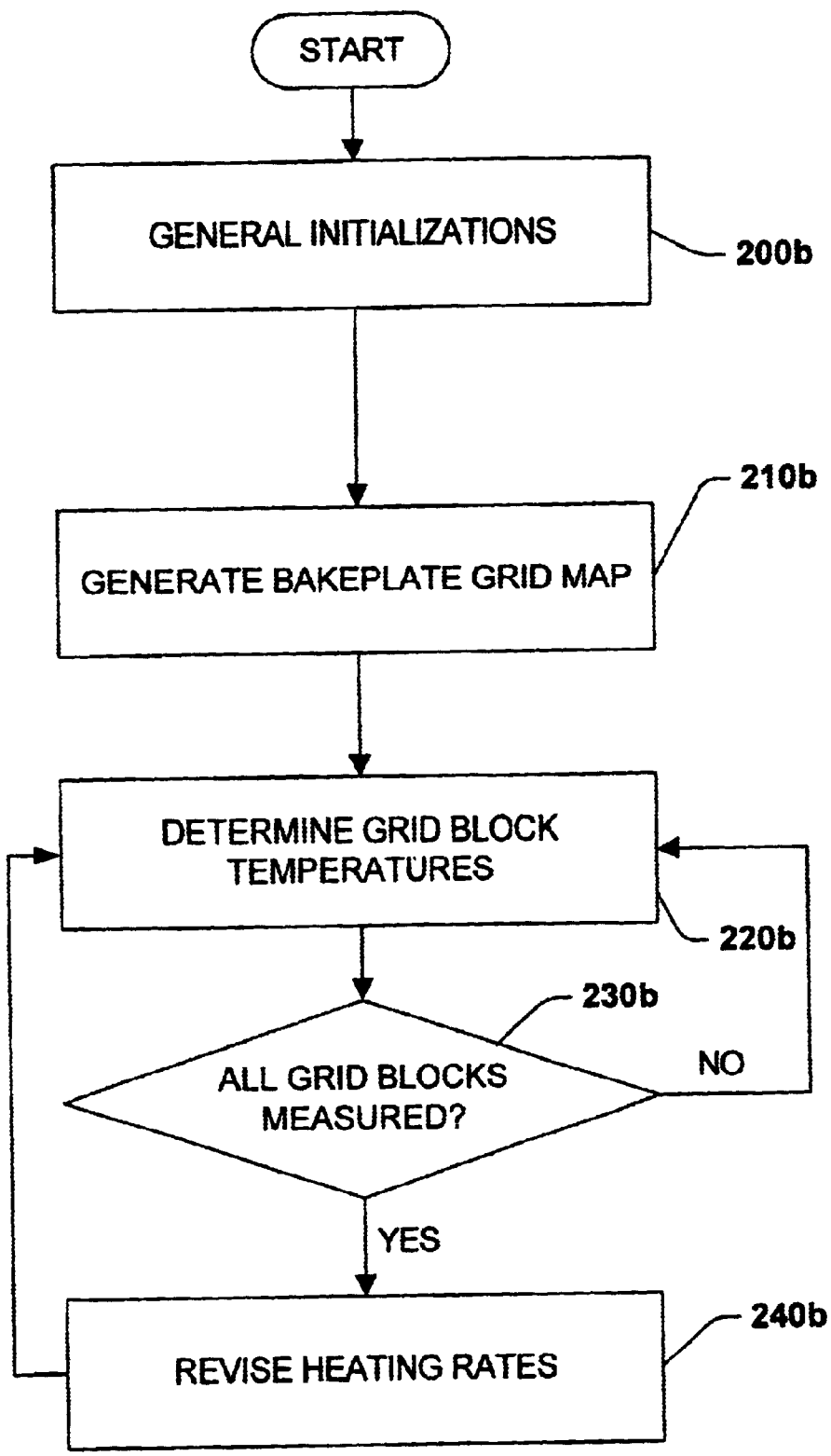
FIG. 6 is a flow diagram illustrating another specific methodology for carrying out the present invention.

FIG. 6 is a flow diagram illustrating another particular methodology for carrying out the present invention. In step 200b, the processor 60 performs general initializations to the photoresist heating system 20b. In step 210b, the bakeplate is mapped into gridblocks XY. In step 220b, temperature determinations are made with respect to the various bakeplate portions mapped by the respective grid blocks XY. In step 230b, the processor 60 determines if all grid block measurements have been taken. If no, the processor 60 returns to step 220b. In step 240b, the processor 60 adjusts the heating rate for each lamp in accordance with the most recently measured temperatures, any temperatures determined during preceding iterations, and target temperature levels for the current time all in accordance with the control strategy. The present iteration is then ended and the process returns to step 220b to perform another iteration.

The present invention provides for a system and method for heating a photoresist in a substantially uniform manner. As a result, the present invention facilitates improving photoresist integrity and reliability which in turn affords increases in quality of image transfer in lithographic processes employing a photoresist heated in accordance with the present invention.

What has been described above is the present invention and several of its specific aspects. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A photoresist heating system, comprising:
    a bakeplate;
    a plurality of lamps;
    a plurality of optical fibers configured to direct radiation to various portions of the bakeplate;
    a lamp driving system configured to drive said lamps;
    a measuring system configured to measure a parameter indicative of temperature at a plurality of locations on a photoresist coated on a wafer when such a coated wafer is placed on the bakeplate; and
    a processor operatively coupled to the measuring system and the lamp driving system, the processor receiving data from the measuring system and controlling, at least partially based on such data, the lamp driving system so as to regulate photoresist temperature.

2. The system of claim 1, wherein the measuring system includes an interferometer.

3. The system of claim 1, wherein the measuring system includes a spectrophotometer.

4. The system of claim 3, wherein the processor analyzes data relating to color of the photoresist.

5. The system of claim 3, wherein the processor analyzes data relating to absorptivity of the photoresist.

6. A system, comprising;
    a bakeplate;
    a plurality of lamps;
    a plurality of optical fibers configured to direct radiation to various portions of the bakeplate;
    a lamp driving system configured to drive the lamps;
    a measuring system configured to measure a parameter indicative of temperature at a plurality of locations on the bakeplate; and
    a processor operatively coupled to the measuring system and the lamp driving system, the processor being capable of receiving data from the measuring system and controlling, at least partially based on such data, the lamp driving system so as to regulate temperature at the plurality of locations.

7. The system of claim 6, wherein the measuring system is based on reflected radiation.

8. The system of claim 7, wherein the measuring system includes an interferometer.

9. The system of claim 7, wherein the measuring system includes a spectrophotometer.

10. The system of claim 9, wherein the processor is configured to analyze data relating to color of the bakeplate.

11. The system of claim 9, wherein the processor is configured to analyze data relating to absorptivity of the bakeplate.

12. The system of claim 11, wherein the bakeplate includes a substantially inert material that causes a color to vary with changes in temperature.

13. The system of claim 12, wherein the substantially inert material includes europium chelate.

14. A method for regulating coating temperature, comprising:
   placing a wafer coated with a coating on top of a bakeplate;
   heating a plurality of portions of the bake plate with a plurality of heating lamps;
   directing radiation to the plurality of portions of the bakeplate via optical fibers:
   measuring via reflected radiation a parameter indicative of the coating temperature at a plurality of locations on the coating; and
   controlling heating of bakeplate portions, independently of heating of other bakeplate portions, to regulate coating temperature at each of the plurality of locations.

15. The method of claim 14, wherein the measuring includes using an interferometer to measure reflected radiation.

16. The method of claim 14, wherein the measuring includes using a spectrophotometer to measure reflected radiation.

17. The method of claim 14, the coating being a photoresist coating.

18. The method of claim 14, the coating being a top anti-reflective coating.

19. The method of claim 14, the coating being a bottom anti-reflective coating.

20. The method of claim 14, the coating being a low K dielectric material.

21. The method of claim 14, the coating being spin on glass.

22. The method of claim 14, the coating being spin-on material.

23. A method for regulating coating temperature, comprising:
   placing a coated wafer on top of a bakeplate;
   heating a plurality of portions of the bake plate with a plurality of heating lamps;
   directing radiation to the plurality of portions of the bakeplate via optical fibers;
   measuring via reflected radiation a parameter indicative of bakeplate temperature at a plurality of locations on the bakeplate; and
   controlling heating of each of the bakeplate portions, independently of heating of bakeplate portions to regulate bakeplate temperature at each of the corresponding plurality of locations.

24. A system for regulating temperature of a photoresist coating a wafer supported by a bakeplate, comprising:
   means for monitoring temperature of portions of the photoresist corresponding to portions of the bakeplate; and
   means for directing radiation to portions of the bakeplate via optical fibers: and
   means for selectively heating a plurality of the portions of the bakeplate with a plurality of lamps so as to regulate temperature of the photoresist.

25. A system for regulating temperature of a photoresist coating a wafer supported by a bakeplate, comprising:
   a temperature measuring system for measuring temperature of various portions of the photoresist;
   a temperature measuring system for measuring temperature of the bake plate by directing radiation thereupon via optical fibers;
   a system for mapping the photoresist portions with portions of the bakeplate; and
   a system for selectively heating the bakeplate portions with a plurality of heating lamps so as to control temperature of corresponding photoresist portions.

* * * * *